US011651925B2

(12) United States Patent
Smith et al.

(10) Patent No.: US 11,651,925 B2
(45) Date of Patent: May 16, 2023

(54) VACUUM CHANNEL TRANSISTOR STRUCTURES WITH SUB-10 NANOMETER NANOGAPS AND LAYERED METAL ELECTRODES

(71) Applicant: INTERNATIONAL BUSINESS MACHINES CORPORATION, Armonk, NY (US)

(72) Inventors: Joshua T. Smith, Croton on Hudson, NY (US); Benjamin Wunsch, Mt. Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 17/146,515

(22) Filed: Jan. 12, 2021

(65) Prior Publication Data

US 2021/0166908 A1 Jun. 3, 2021

Related U.S. Application Data

(63) Continuation of application No. 16/142,208, filed on Sep. 26, 2018, now Pat. No. 10,937,620.

(51) Int. Cl.
*H01L 21/00* (2006.01)
*H01J 21/10* (2006.01)
(Continued)

(52) U.S. Cl.
CPC .......... *H01J 21/105* (2013.01); *H01J 1/3042* (2013.01); *H01L 21/3215* (2013.01); *H01L 29/41725* (2013.01); *H01J 2201/319* (2013.01)

(58) Field of Classification Search
CPC ... H01J 21/105; H01J 1/3042; H01L 21/3215; H01L 29/41725; H01L 29/06; H01L 29/76
See application file for complete search history.

(56) References Cited

U.S. PATENT DOCUMENTS 3,755,704 A   8/1973  Spindt
4,827,177 A * 5/1989  Lee ..................... H01J 21/105
                                              313/355
(Continued)

FOREIGN PATENT DOCUMENTS

WO    2009151170 A1   12/2009
WO    2016182080 A1   11/2016

OTHER PUBLICATIONS

C.-H. Kuo et al., "Characterisation of a suspended nanowire channel thin-film transistor with sub-100 nm air gap," IET Micro & Nano Letters, 6, pp. 543-545, Feb. 27, 2011.
(Continued)

*Primary Examiner* — Mounir S Amer
*Assistant Examiner* — Alexander Belousov
(74) *Attorney, Agent, or Firm* — Cantor Colburn LLP; Stosch Sabo

(57) ABSTRACT

A technique relates to a semiconductor device. An emitter electrode and a collector electrode are formed in a dielectric layer such that a nanogap separates the emitter electrode and the collector electrode, a portion of the emitter electrode including layers. A channel is formed in the dielectric layer so as to traverse the nanogap. A top layer is formed over the channel so as to cover the channel and the nanogap without filling in the channel and the nanogap, thereby forming a vacuum channel transistor structure.

20 Claims, 11 Drawing Sheets

(51) Int. Cl.
*H01J 1/304* (2006.01)
*H01L 21/3215* (2006.01)
*H01L 29/417* (2006.01)

(56) References Cited

U.S. PATENT DOCUMENTS

| | | | | |
|---|---|---|---|---|
| 5,204,588 A * | 4/1993 | Ugajin | ............... | H01J 21/105 |
| | | | | 313/309 |
| 5,266,155 A * | 11/1993 | Gray | ............... | H01J 1/3042 |
| | | | | 216/99 |
| 6,437,360 B1 * | 8/2002 | Cho | ............... | H01J 21/105 |
| | | | | 257/407 |
| 8,115,207 B2 * | 2/2012 | Kim | ............... | H01J 21/10 |
| | | | | 313/496 |
| 8,159,119 B2 * | 4/2012 | Kim | ............... | H01J 21/10 |
| | | | | 313/311 |
| 9,029,211 B2 * | 5/2015 | Xiao | ............... | H01L 29/66969 |
| | | | | 438/282 |
| 9,093,508 B1 * | 7/2015 | Xiao | ............... | H01L 29/26 |
| 9,147,755 B1 * | 9/2015 | Han | ............... | H01L 29/66977 |
| 9,331,189 B2 * | 5/2016 | Kim | ............... | H01J 1/3046 |
| 9,680,116 B2 * | 6/2017 | Cao | ............... | H01L 29/0673 |
| 9,715,987 B2 * | 7/2017 | Xiao | ............... | H01J 9/385 |
| 9,853,163 B2 * | 12/2017 | Zhang | ............... | H01J 21/105 |
| 9,941,088 B2 * | 4/2018 | Briggs | ............... | G06F 30/327 |
| 10,062,857 B2 * | 8/2018 | Cao | ............... | H01L 51/0562 |
| 10,347,456 B1 * | 7/2019 | Ok | ............... | H01J 19/24 |
| 10,573,482 B2 * | 2/2020 | Cao | ............... | H01J 21/08 |
| 10,937,620 B2 * | 3/2021 | Smith | ............... | H01L 29/41725 |
| 2017/0062743 A1 * | 3/2017 | Cao | ............... | H01L 51/0048 |
| 2017/0250359 A1 * | 8/2017 | Cao | ............... | H01J 21/105 |
| 2018/0017524 A1 * | 1/2018 | Pyzyna | ............... | B01L 3/502707 |
| 2018/0097118 A1 * | 4/2018 | Zhang | ............... | H01L 29/78642 |
| 2018/0102433 A1 * | 4/2018 | Liu | ............... | H01L 29/66666 |
| 2018/0218871 A1 * | 8/2018 | Cao | ............... | H01L 41/0475 |
| 2018/0218872 A1 * | 8/2018 | Cao | ............... | H01L 41/29 |
| 2019/0378675 A1 * | 12/2019 | Ok | ............... | H01J 19/24 |
| 2020/0090896 A1 * | 3/2020 | Cao | ............... | H01L 41/094 |
| 2020/0098534 A1 * | 3/2020 | Smith | ............... | H01L 21/3215 |

OTHER PUBLICATIONS

J.-W. Han et al., "Nanoscale Vacuum Channel Transistor" IEEE International Conference on Nanotech, pp. 172-175, Aug. 2014.
List of IBM Patents or Patent Applications Treated as Related; Date Filed: Jan. 12, 2021, 2 pages.
Smith et al., "Vacuum Channel Transistor Structures With Sub-10 Nanometer Nanogaps and Layered Metal Electrodes," U.S. Appl. No. 16/142,208, filed Sep. 20, 2018.

* cited by examiner

VACUUM CHANNEL TRANSISTOR STRUCTURES WITH SUB-10 NANOMETER NANOGAPS AND LAYERED METAL ELECTRODES

This application is a continuation of U.S. patent application Ser. No. 16/142,208, filed Sep. 26, 2018, the disclosure of which is incorporated by reference herein in its entirety.

BACKGROUND

The present invention generally relates to fabrication methods and resulting structures for semiconductor devices, and more specifically, to vacuum channel transistor structures with down to sub-10 nanometer nanogaps and layered metal electrodes.

In electronics, a vacuum tube (also referred to as an electron tube or a tube) is a device that controls electric current between electrodes in an evacuated container. Vacuum tubes mostly rely on thermionic emission of electrons from a hot filament or a heated cathode. This type of vacuum tube is called a thermionic tube or thermionic valve.

In semiconductors, however, metal-oxide-semiconductor field-effect transistors (MOSFET) are used for amplifying or switching electronic signals. The MOSFET has a source, a drain, and a metal oxide gate electrode. The metal gate portion of the metal oxide gate electrode is electrically insulated from the main semiconductor n-channel or p-channel by a thin layer of insulating material, for example, silicon dioxide or a high-k material, which controls the conductivity of the MOSFET channel with applied gate bias. The gate voltage controls whether the current path from the source to the drain is an open circuit ("off") or a low resistance path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes, or missing electrons, as the current carriers. Complementary metal oxide semiconductor (CMOS) is a technology that uses complementary and symmetrical pairs of p-type and n-type MOSFETs to implement logic functions.

SUMMARY

Embodiments of the invention are directed to a method for forming a semiconductor device. A non-limiting example of the method includes forming an emitter electrode and a collector electrode in a dielectric layer such that a nanogap separates the emitter electrode and the collector electrode, a portion of the emitter electrode including layers. The method includes forming a channel in the dielectric layer so as to traverse the nanogap and forming a top layer over the channel so as to cover the channel and the nanogap without filling in the channel and the nanogap, thereby forming a vacuum channel transistor structure.

Embodiments of the invention are directed to a semiconductor device. A non-limiting example of the semiconductor device includes an emitter electrode and a collector electrode formed in a dielectric layer such that a nanogap separates the emitter electrode and the collector electrode, a portion of the emitter electrode including layers. The semiconductor device includes a channel formed in the dielectric layer so as to traverse the nanogap and a top layer over the channel so as to cover the channel and the nanogap without filling in the channel and the nanogap, thereby forming a vacuum channel transistor structure.

Embodiments of the invention are directed to a semiconductor device. A non-limiting example of the semiconductor device includes an emitter electrode and a collector electrode formed in a dielectric layer such that a nanogap separates the emitter electrode and the collector electrode, a portion of the emitter electrode including layers of low workfunction material and high workfunction material. The emitter electrode includes one or more elongated emitter tips, and the collector electrode includes one or more elongated collector tips. The semiconductor device includes a channel formed in the dielectric layer so as to traverse the nanogap, and a top layer over the channel so as to cover the channel and the nanogap without filling in the channel and the nanogap. The semiconductor device includes one or more vent holes formed in the top layer so as to communicate with the channel, and a cover material sealing the one or more vent holes.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1A:
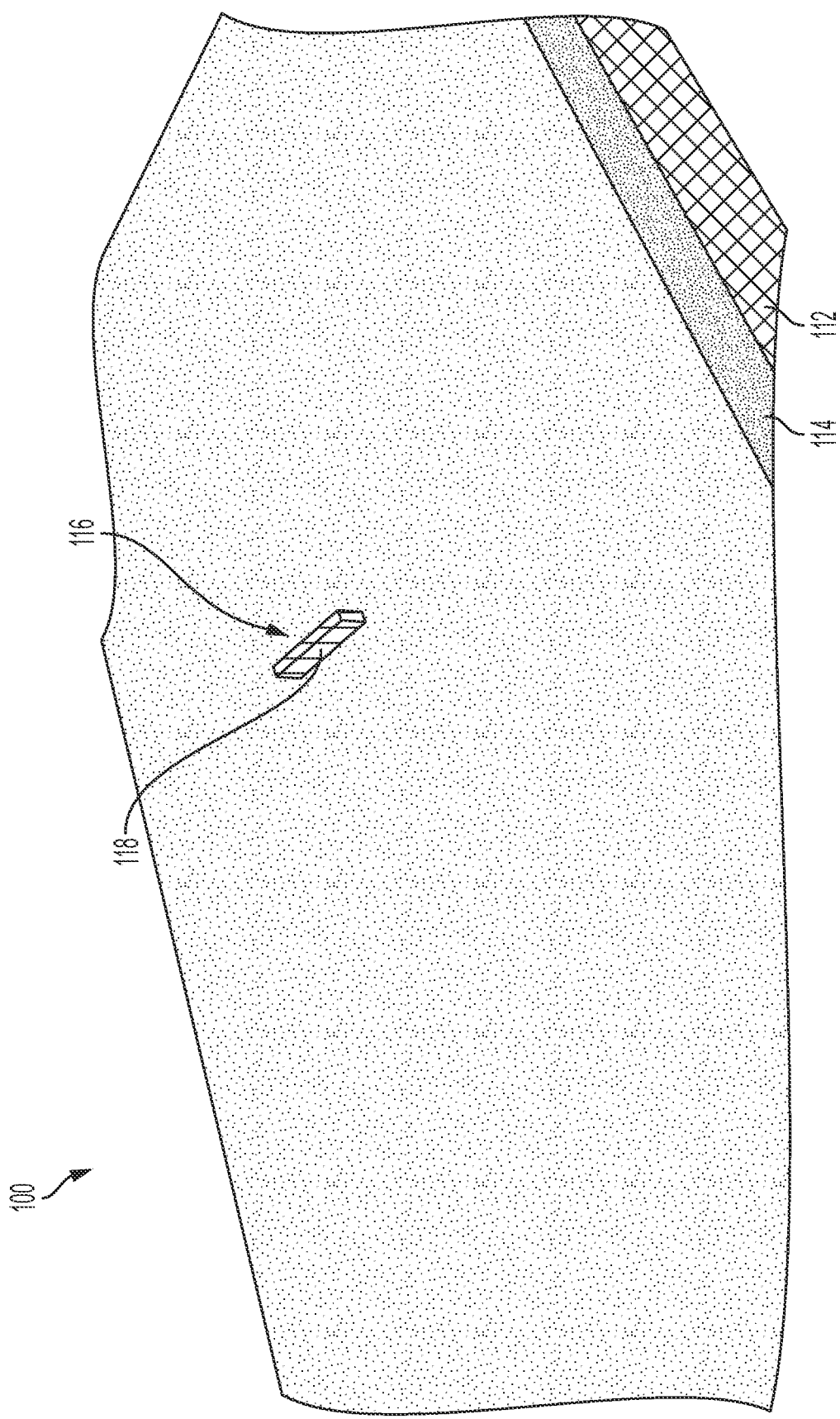
FIG. 1A depicts a perspective view of a semiconductor device after an initial set of fabrication operations according to embodiments of the invention.

The diagrams depicted herein are illustrative. There can be many variations to the diagram or the operations described therein without departing from the spirit of the invention. For instance, the actions can be performed in a differing order or actions can be added, deleted or modified.

Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, early electronics were focused on vacuum tubes, which are used to amplify, switch, or modulate electrical signals. It has been many decades since vacuum tubes have been replaced by solid-state devices such as the diode, bipolar junction transistor (BJT), and metal-oxide-semiconductor field-effect transistor (MOSFET). Nevertheless, vacuum tubes are still used in niche applications such as premier sound systems and high-power radio base stations. The transition from the vacuum tube to the solid-state device was not driven by the superiority of the semiconductor as a carrier transport medium but by the ease of fabrication, low cost, low-power consumption, lightness, long lifetime, and ideal form factor for integrated circuits (ICs). Vacuum tubes were fabricated by mechanical machining and used as discrete components, whereas modern solid-state devices are batch processed in assembling integrated circuits. The vacuum tube device is more robust than solid-state devices in extreme environments involving high temperature and exposure to various radiations. The notable tradeoff is that vacuum tubes yield higher frequency/power output but consume more energy than the MOSFET. The vacuum is intrinsically superior to the solid as a carrier transport medium since the vacuum allows ballistic transport while the carriers suffer from optical and acoustic phonon scattering in semiconductors. The velocity of electrons in a vacuum is theoretically $3 \times 10^{10}$ cm/s, but the velocity of electrons is limited to about $5 \times 10^7$ cm/s in semiconductors. Because the cathodes of vacuum tubes need to be heated for thermionic emission of electrons, the energy for heating adversely overwhelms the energy required for field emission. The vacuum device is, therefore, not suitable for low-power devices.

In 1973, Charles Spindt and his colleagues at the Stanford Research Institute fabricated miniaturized field emission vacuum tubes using the same processing techniques used for integrated circuits (IC). The electrical characteristics of this architecture were relatively difficult to control. However, a Vanderbilt University research team made a field emission device from diamonds. Diamonds have an extremely low workfunction, so it can produce emission electrons at low voltage. These diamond devices could operate over a temperature range from 77° K. (liquid $N_2$) up to 500° C. They were inherently radiation resistant making them useful for applications in space. The primary issues with this architecture are difficultly with definition of the gate, and the fact that some current is drawn through the gate. The gaps separating the emitter tips and collector electrodes were also very large (several microns) with no clear path to scale, making voltage scaling difficult.

In 2012, researchers from NASA Ames Research Center in Moffett Field, Calif. developed a planar process for fabricating an electron emission device in silicon, which they called a vacuum channel transistor. Their work builds on previous efforts by the Korea Advanced Institute of Science and Technology (KR) in 2002. Using a photoresist ashing technique, a nanogap was created in silicon nanowires down to 150 nm, forming emitter and collector electrodes. Operation at less than 10 volts was achieved with a cut-off frequency of 460 GHz. Authors predicted THz frequencies were possible if a sufficiently small gap (about 10 nm) could be realized. Accessing the THz frequency range of operation has application in hazardous chemical sensing, noninvasive medical diagnostics, and high speed telecommunications. Despite claims of being able to potentially access these small dimensions, no further work has been reported by this group. It is unlikely that such a small gap can be achieved using their established process and much less likely that such a technique can produce many devices with uniform gaps. Also, their fabrication process is centered on definition of the emitter and collector electrodes in silicon, which is not the best material choice for an electron emitter.

A more optimal solution is to combine the advantages of both devices by miniaturizing the vacuum tube to the nanoscale according to embodiments of the invention. In an ideal scenario, size scaling would be combined with low workfunction materials to decrease the gate and drain voltages to less than a volt thereby permitting a competitive alternative to the modern MOSFET according to embodiments of the invention.

Turning now to an overview of the aspects of the invention, one or more embodiments of the invention provide semiconductor devices and a method of forming the semiconductor devices as vacuum channel transistor structures with sub-10 nanometer nanogaps and layered metal emitters. Embodiments of the invention provide methods and structures for a high frequency and/or high power output transistor device, which is more stable in extreme environments involving radiation and high temperature than modern solid-state transistors. Specifically, significantly lower power operation is enabled in a vacuum channel transistor configuration using manufacturable processes to create sub-10 nm gaps between the metal emitter electrodes and collector electrodes. Further enhancement to collector current at lower operating voltage is achieved using a layered metal emitter and/or multi-emitter electrode configuration.

More particularly, embodiments of the present invention propose implementation of a metal nanowire emitter and collector with a nanogap defined using a sacrificial knockoff layer, having demonstrated reproducible gaps as small as 8 nm. At this distance, the vacuum channel transistor device can operate in a vacuum (which satisfies the condition of ballistic transport), and operating voltages can be competitive with the MOSFET. A water-based polish process is used subsequent to lithography, dielectric etch, and metal evaporation to define the electrodes in an oxide. Because the electrodes are formed with a metal deposition process, one or more thin, low workfunction metal layers (e.g., about 1 to 5 nanometers thick) can be deposited in between other metals of the (emitter) electrode, and use of the low workfunction metal layers enhances the field at the portion(s) of the tip emitting electrons (low workfunction regions) while allowing electrons to flow freely throughout the entire emitter cross-section up to the tip. Additionally, the vacuum channel transistor device can include many planar emitter electrode configurations, including multi-emitter nanowire arrays, to enhance the current. Emission can be controlled in any of these configurations with either a global or local bottom gate architecture.

Turning now to a more detailed description of aspects of the present invention, FIG. 1A depicts a semiconductor device 100 after fabrication operations according to embodiments of the invention. The semiconductor device 100 is the air/vacuum channel transistor device discussed herein. After initial fabrication operations, the semiconductor device 100 includes a substrate 112 which has a dielectric layer 114 formed thereon. The substrate 112 can include any suitable substrate material or materials. For example, the substrate 112 can include a semiconductor material, a ceramic, glass, quartz, etc. In some embodiments of the invention, the substrate 112 includes a silicon based semiconductor material, e.g., Si, SiGe, SiC, etc., and the dielectric layer 114 can include an oxide, such as silicon dioxide ($SiO_2$), or silicon nitride ($Si_3N_4$). The dielectric layer 114 can be a low-k material, for example, having a K value lower than silicon dioxide ($SiO_2$). The dielectric layer 114 can be grown, transferred, or deposited on the substrate 112.

A nanogap location is defined by forming a knockoff layer 116 and patterning the knockoff layer 116 to form a knockoff line 118. The knockoff layer 116 can be spun onto the surface of the dielectric layer 114. The knockoff layer 116 can include a high resolution resist, such as hydrogen silsesquioxane (HSQ) and/or other resist material that can be defined using an electron beam (e-beam) or the like. In some embodiments of the invention, the knockoff line 118 is written in a knockoff layer 116 using e-beam lithography to define a narrow line for the knockoff line 118. The HSQ, a high resolution negative e-beam resist, is reacted using the e-beam, and the remainder of the resist is removed by a developer leaving only the knockoff line 118 on the dielectric layer 114. The knockoff line 118 will serve as a release layer to remove metal deposited in the gap region in subsequent fabrication operations.

Figure 1B:
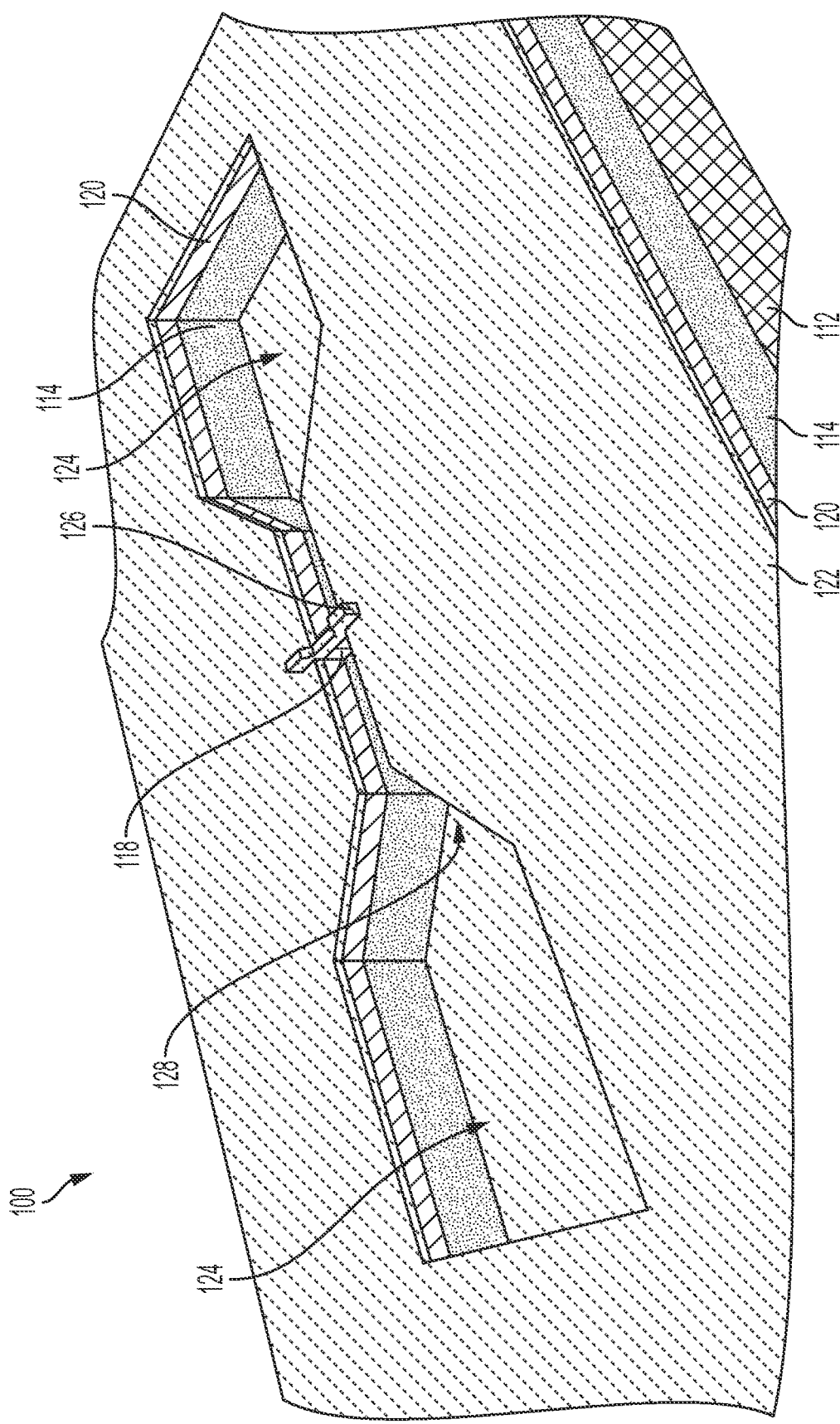
FIG. 1B depicts a perspective view of the semiconductor device according to embodiments of the invention.

FIG. 1B depicts the semiconductor device 100 after fabrication operations according to embodiments of the invention. A resist 120 is deposited or spun onto a surface of the dielectric layer 114. The resist 120 buries the knockoff line 118 therein. The resist 120 is exposed to light, e-beam lithography, etc., to define a pattern for electrode formation (i.e., which will open up windows). The resist 120 is exposed to a pattern of radiation and then developed utilizing a developer. Once the patterning of the resist is completed, the sections of the dielectric layer 114 that are covered by the resist 120 are protected while the exposed regions are partially removed, e.g., removed up to a well-defined depth, using a selective etching process that removes the unprotected regions of the dielectric layer 114, thereby forming a well or trench 124 defines the desired geometry of the electrodes. The trench 124 includes a gap region 128 in the middle, and the gap region 128 is narrower than the end portions of the trench 124. The etch process can include a reactive ion etch (RIE). The trench 124 is etched into the dielectric layer 114, which provides electrical isolation. Prior to deposition of the dielectric layer 114 on the substrate 112, other fabrication operations can be performed, such as depositing a high-k dielectric layer 450, forming a local back gate 404, etc., as discussed further herein.

The RIE does not remove the knockoff line 118, which remains on the dielectric layer 114 and within the resist 120. However, the knockoff line 118 can be slightly eroded during the RIE process making it slightly thinner than the width defined by e-beam lithography. The knockoff line 118 remains in the gap region 128 between the electrode shapes in the trench 124. The RIE forms anisotropic trench walls without undercutting of the resist 120.

Once the trench 124 is formed into the dielectric layer 114, a metal layer 122 is deposited, which covers the resist 120 outside the trench 124 (field regions) and the dielectric layer 114 in the trench 124. Prior to deposition of the metal layer 122, a thin adhesion layer (not shown) can be deposited, e.g., 0.2 nm-2 nm of Ti or Cr. The adhesion layer can be formed so that the noble metal of metal layer 122 will not delaminate.

Figure 3:
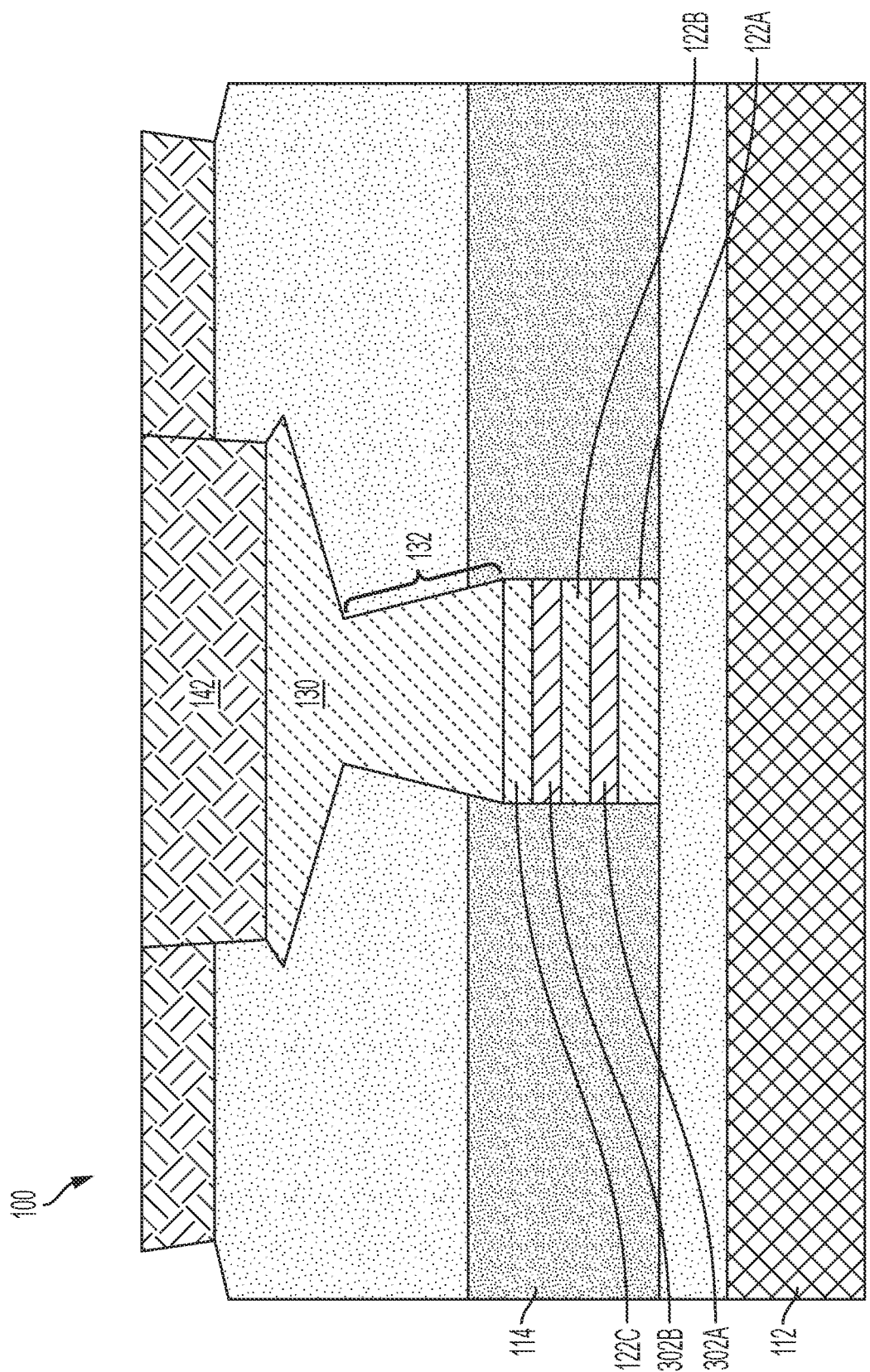
FIG. 3 depicts a perspective view of the semiconductor device having a cut-way portion according to embodiments of the invention.

The metal deposition process of metal layer 122 also covers the knockoff line 118 with a metal portion 126 as well. The metal layer 122 is excluded from the area where the knockoff line 118 is located in the gap region 128 because this location of the knockoff line 118 will eventually serve as the nanogap 138 in FIG. 1D. The metal deposition process can include chemical vapor deposition (CVD), atomic layer deposition (ALD), sputtering, etc. In some embodiments of the invention, e-beam evaporation is employed to fill the trench 124 (along with the gap region 128 of the trench 124) with a noble metal until the metal layer is coplanar with the surface of the dielectric layer 114. The noble metal 122 can include Pd, Pt, Au, etc. In some embodiments of the invention, the metal deposition process deposits multiple layers of high workfunction metals and low workfunction metals as depicted in FIG. 3.

Figure 1C:
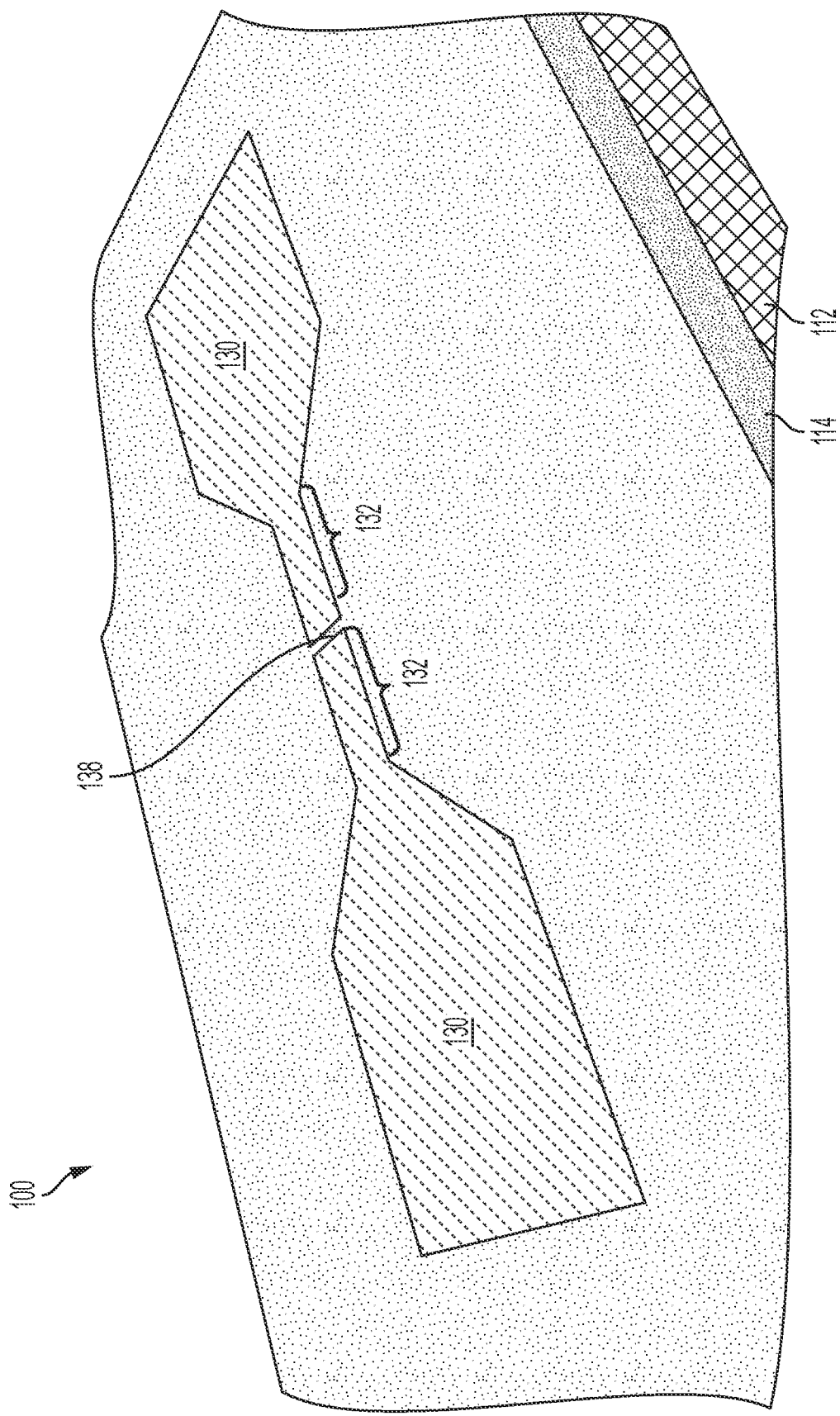
FIG. 1C depicts a perspective view of the semiconductor device according to embodiments of the invention.

The metal deposition process is the formation of electrodes 130 (as depicted in FIG. 1C) which are formed independently of each other since they are separated by the knockoff line 118. In other words, the electrodes 130 are formed on either side of the nanogap 138 shown in FIG. 1D.

Referring to FIG. 1C, a planarization process is employed to remove unwanted metal 122 and the under layer of resist 120. In some embodiments of the invention, a water polish is employed. The water polish uses an appropriate down force to selectively and concurrently remove the resist 120 (which acts as a release layer), knockoff line 118 along with metal portion 126 on top, and unwanted metal 122 in the field regions on top of the resist 120 while keeping electrodes 130 in the trenches 124 (including in the gap region 128) intact. The polish process reduces fencing that can occur at the boundaries of deposited materials defined by traditional liftoff.

After removing the unwanted metal 122 and the resist 120, electrodes 130, which include transverse electrode tips or nanoelectrodes 132, are formed from the metal layer 122 (e.g., by controlling the deposition rate and having a well-defined RIE etch process). As seen in FIG. 1C, one electrode tip/nanoelectrode 132 extends from each of the electrodes 130. Removal of the knockoff line 118 creates the nanogap 138 by preventing metal of electrodes 130 from coating this region. In this way, the two electrodes 130 having their own electrode tips/nanoelectrodes 132 can be independently formed on either side of the nanogap 138 disposed between the nanoelectrodes 132. Each electrode 130 is spaced apart from the other by the nanogap 138.

The sacrificial knockoff line 118 is sheared off during the water polish process. The sacrificial knockoff line 118 is left uncured to ensure easy removal, and any residual sacrificial knockoff line 118 remaining is etched during the nanochannel etch process (as discussed below), which etches the uncured sacrificial knockoff line 118 much faster than silicon dioxide.

Figure 1D:
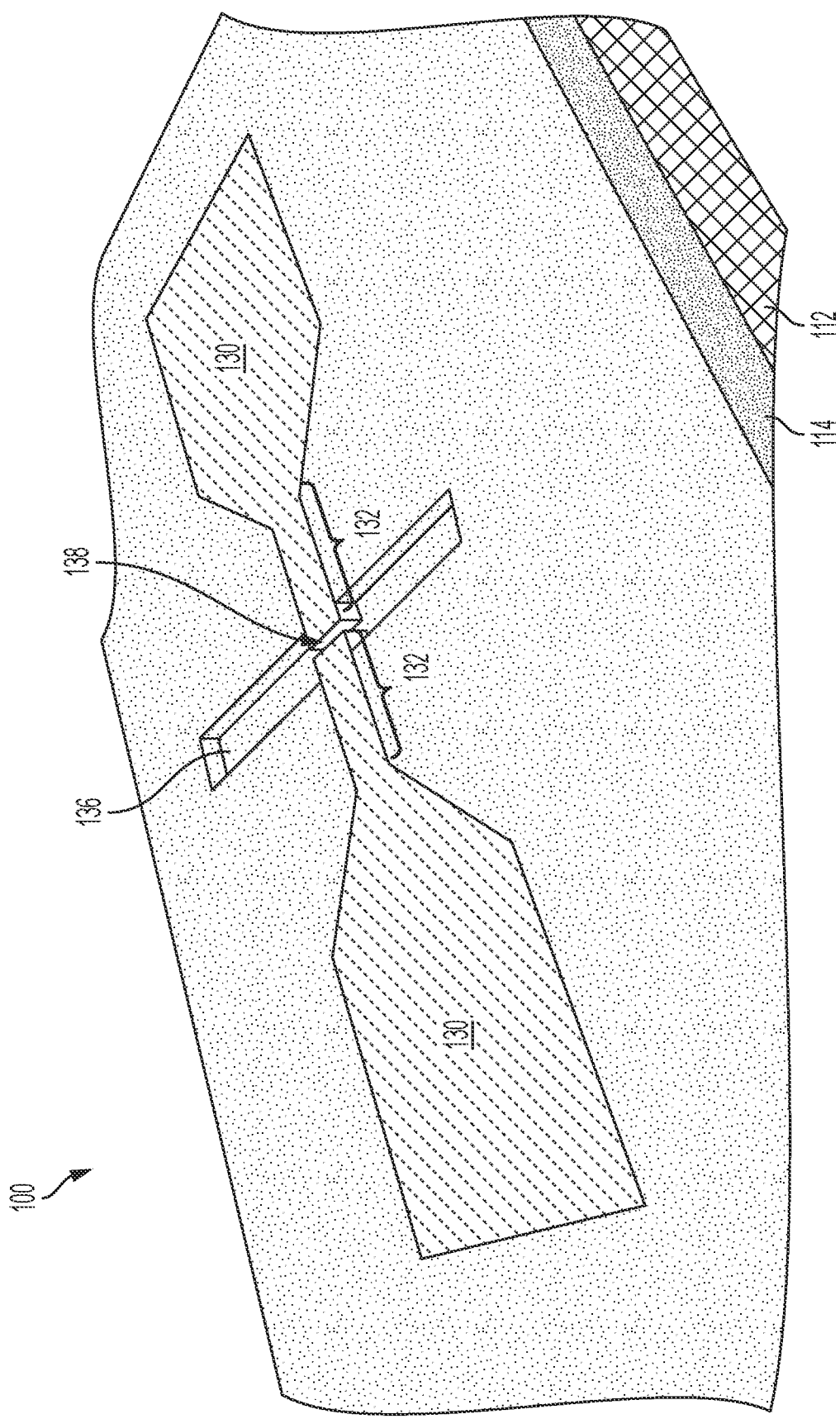
FIG. 1D depicts a perspective view of the semiconductor device according to embodiments of the invention.

Referring to FIG. 1D, lithography or other techniques are employed to further pattern the dielectric layer 114. A nanochannel 136 is formed in the dielectric layer 114. The nanochannel 136 coincides with the nanogap 138. Any residual material of the knockoff line 118 can be removed in the etching/formation of the nanochannel 136 and/or can be removed by a separate etch process. To form the nanochannel 136, a RIE etch can be employed that is channel aligned to the transverse electrode tips/nanoelectrodes 132.

Accordingly, the nanochannel 136 is formed having the nanogap 138 between two electrodes 130. The electrodes 130 are formed with a noble metal to prevent corrosion and degradation, and the nanogap 138 is formed reliably and accurately. In some embodiments of the invention, the nanogap 138 is formed having a gap width of about 5 nm to 9 nm. The electrode tips/nanoelectrodes 132 are nanowires that extend into the nanochannel 136.

Figure 1E:
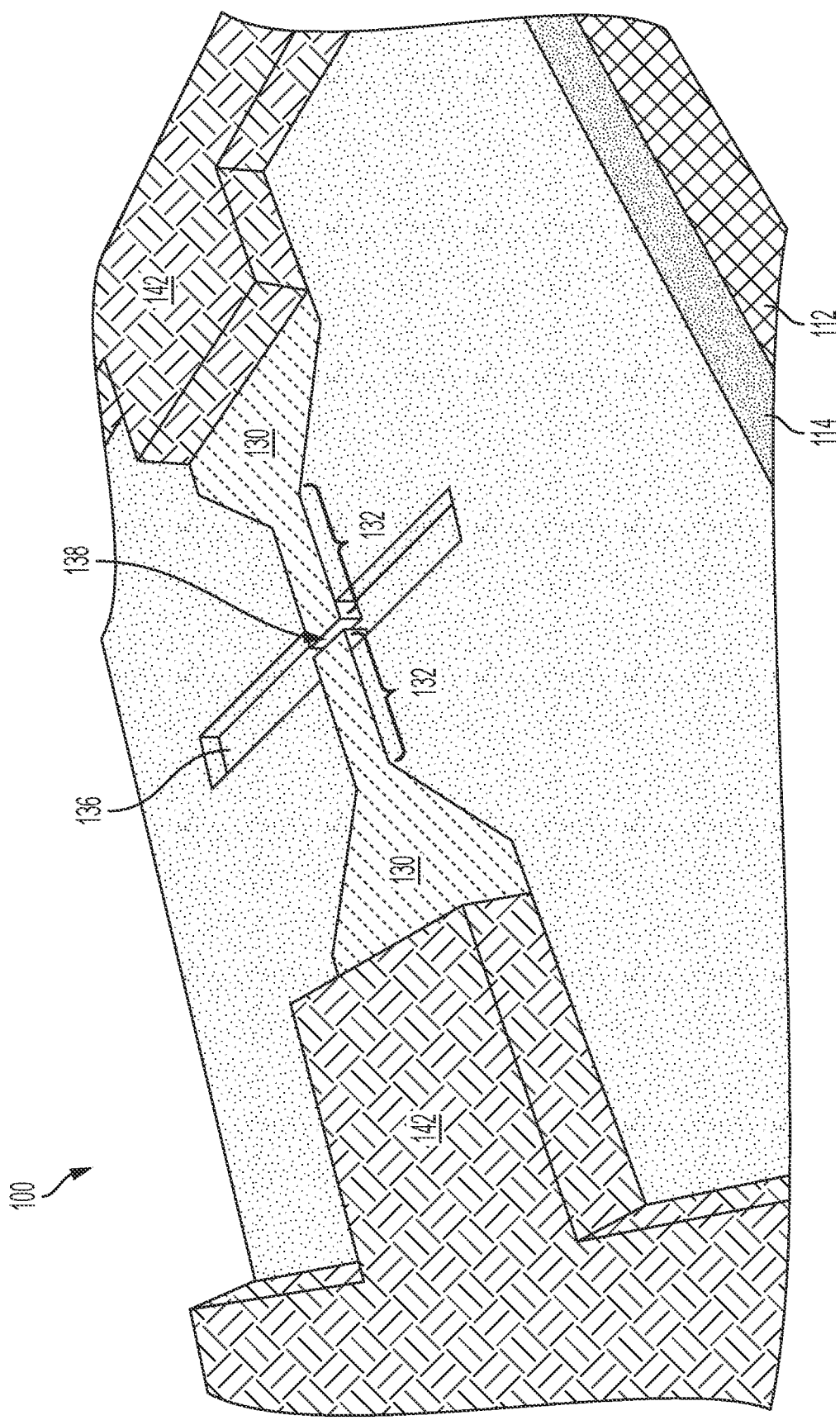
FIG. 1E depicts a perspective view of the semiconductor device according to embodiments of the invention.

FIG. 1E depicts pad definition according to embodiments of the invention. Metal contact probe pads 142 are formed on top of the electrodes 130. For example, lithography is performed to deposit a resist material and pattern the resist material into the desired shapes for the metal contact probe pads 142. Metal is deposited in the patterned shapes and the resist material is removed to leave the metal contact probe pads 142 on top of both the electrodes 130 and a portion of the dielectric 114.

Figure 2:
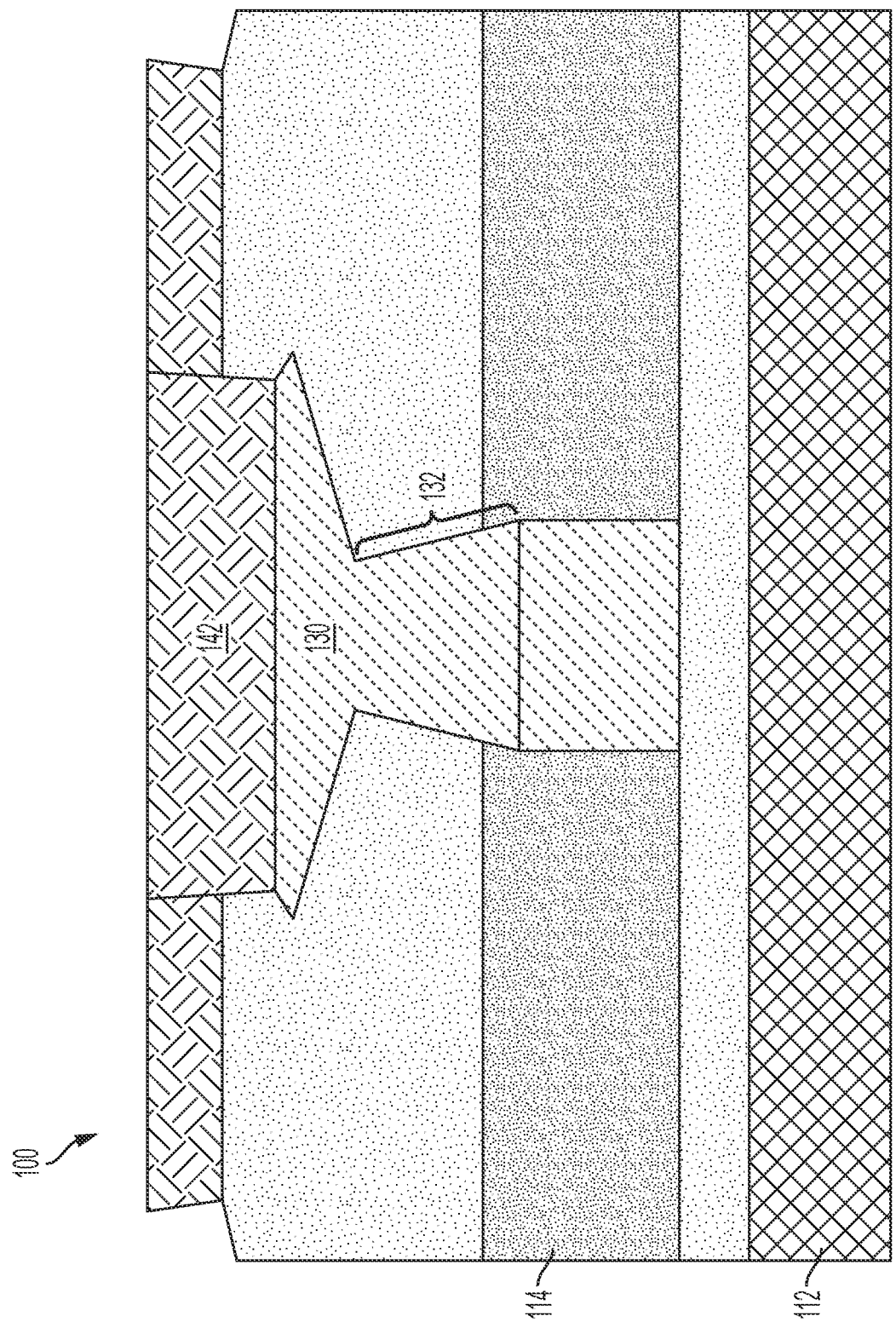
FIG. 2 depicts a perspective view of the semiconductor device having a cut-way portion according to embodiments of the invention.

FIG. 2 depicts a cut-away of a perspective view of the semiconductor device 100 with a monolithic electrode tip 132 (e.g., emitter tip and/or collector tip) of the electrode 130 according to embodiments of the invention. The cut is taken at the nanogap 138 along the nanochannel 136 such that the electrode tip 132 of the electrode 130 is facing the opposite electrode tip 132 of the other electrode 130 (not seen in FIG. 2). Having monolithic electrode tips 132 for the electrodes 130 means that there is a single material used, such as, for example Pd. As noted above, the substrate 112 can be a semiconductor material. As such, the substrate 112 can be highly doped with p-type dopants or n-type dopants to be conductive, such that the substrate 112 is a global backgate for the transistor.

There are various enhancements that can be made to the electrodes 130. As an example of enhancements that can be made to the electrodes 130, FIG. 3 depicts a cut-away of a perspective view of the semiconductor device 100 with layered electrodes 130 according to embodiments of the invention. The layers can be in the entire electrodes 130 in some embodiments of the invention.

In FIG. 3, the cut is taken at the nanogap 138 along the nanochannel 136 such that the electrode tip 132 of the electrode 130 is facing the opposite electrode tip 132 of the other electrode 130 (not seen in FIG. 3). Discussion of the layered electrode tip 132 and/or layered electrode 130 applies to the collector (C) electrode 130 and the emitter (E) electrode 130. For explanation purposes, examples of the emitter electrode tip of the electrode are discussed but it should be appreciated that the teaching applies by analogy to the collector electrode tip as well.

As part of the emitter/collector electrode tip engineering depicted in FIG. 3, deposition of the electrode 130 can be accomplished in one or more layers 302A, 302B low workfunction materials sandwiched between higher workfunction materials, such layers of metal 122, depicted as metal layers 122A, 122B, 122C. Although two low workfunction layers 302A and 302B are depicted for explanation purposes, the layered emitter/collected electrode 130 can have multiple layers of low workfunction materials, such as 1, 2, 3, 4, 5, 6, etc., sandwiched between at least two layers of metal 122. The thickness of each of the low workfunction layers 302A and 302B can be from about 1 nm to 5 nm, and more particularly 1 nm to 2 nm. Some examples of the low workfunction (emitter) materials for low workfunction layers 302A and 302B can include Ba, BaO, Th, W, La, LaO, Y, and Er. Also, the thickness of each of the higher workfunction materials such as metal layers 122A, 122B, 122C can be from about 1 nm to 5 nm, and more particularly 1 nm to 2 nm. Because emission of the electrons is from the emitter electrode to be collected by the collector electrode, the layered electrode enhancement should at least be on the emitter electrode and can optionally be in the collector electrode.

By using the layered emitter electrode 130 having low workfunction layers 302A and 302B, this confines electron emission to a one to a few nanometers thick layer for each low workfunction emitter layer 302A, 302B while the entire wire cross-section can efficiently transport electrons up to the emitter tip. High workfunction layers 122A, 122B, 122C and low workfunction layers 302A, 302B can be formed, for example, by alternating deposition between source materials using e-beam evaporation. Alternatively, co-evaporation of both high and low workfunction together may also be deposited as a single electrode hybrid resembling 100 in FIG. 2.

As previously discussed, the substrate 112 can be highly doped semiconductor material with p-type dopants or n-type dopants to be conductive, such that the substrate 112 is a global backgate. A gate voltage applied to the substrate 112 (i.e., global backgate in this example or a local back gate 404 in FIG. 4) allows electrons to be emitted from the emitter electrode tip 132 of the emitter electrode 130, transported through the nanogap 138, and collected by the collector electrode tip 132 of the collector electrode 130, while a higher voltage is applied to the emitter electrode 130 than the collector electrode 130.

Figure 4:
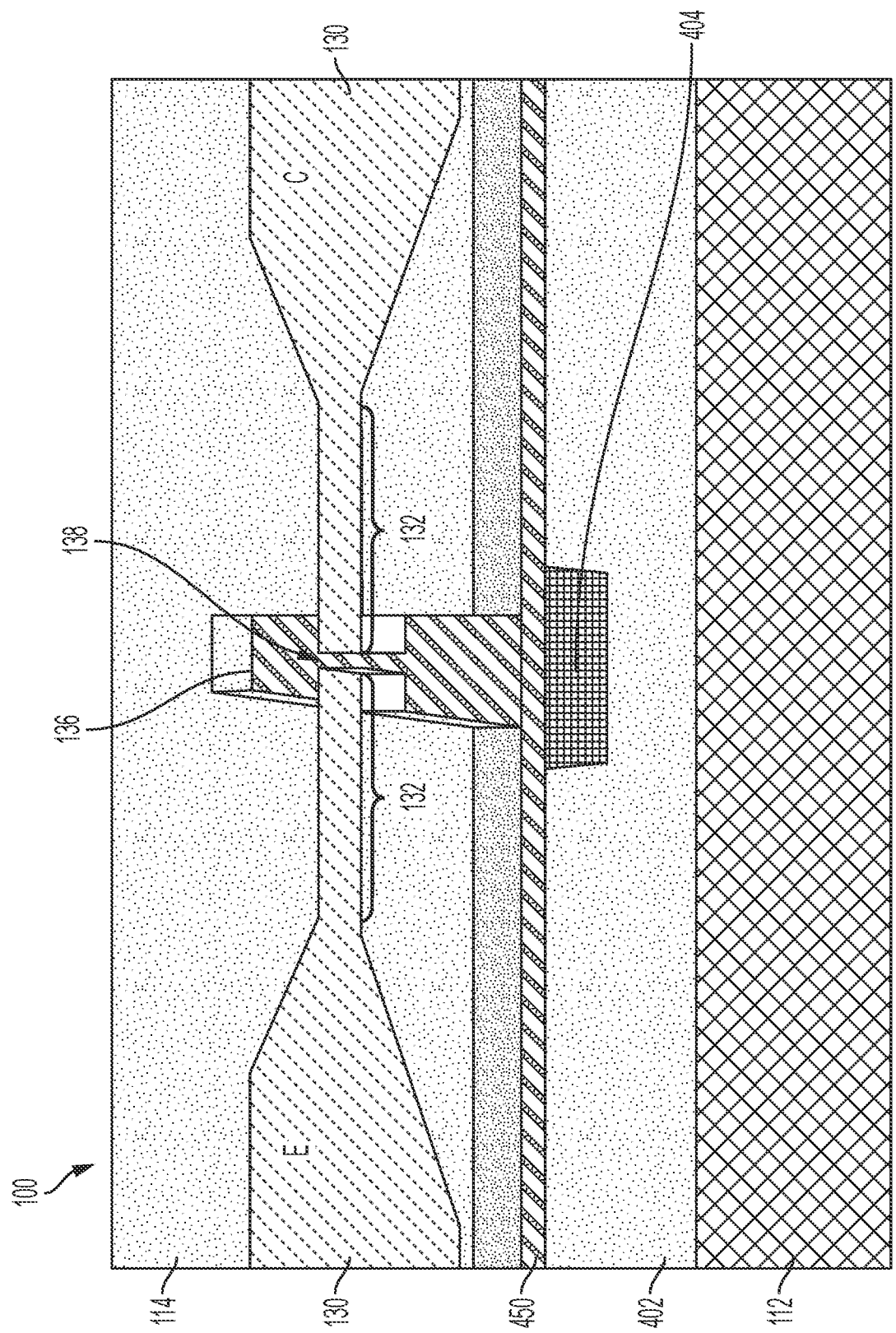
FIG. 4 depicts a perspective view of the semiconductor device having a cut-way portion according to embodiments of the invention.

In addition to making enhancements to the electrodes 130, modifications can be made to the gate architecture such that a local back gate can be used in place of a global backgate. FIG. 4 depicts a cut-away of a perspective view of the semiconductor device 100 with a local bottom/back gate according to embodiments of the invention. The layered emitter and collector electrode tips are not illustrated for simplicity and so as not to obscure the figure, the electrodes 130 are layered as discussed herein.

As an alternative to a global backgate, FIG. 4 shows a local bottom gate structure 404 that permits device isolation and minimizes gate leakage. This local bottom gate structure 404 can be formed by depositing or growing a thick dielectric layer 402 on top of the substrate 112. The thickness of dielectric layer 402 can range from about 1 micron to 5 microns. The dielectric layer 402 can an oxide material such as silicon dioxide. The dielectric layer 402 can be a thermal oxide. FIG. 4 also shows a high-k dielectric layer 450 formed on top of the substrate 112 and underneath the electrode tip 132 of the electrode 130, such that bottom surfaces of the electrode 130 and opposing electrode 130 are formed directly on top of the high-k dielectric layer 450. To form the local bottom gate structure 404, a trench is formed in the dielectric layer 402 and is filled with a metal (e.g., such as tungsten (W) or copper (Cu)). The metal is polished back to the dielectric layer 402 so as to fill trench using CMP, and the high-k gate oxide material 450 is deposited on the dielectric layer 402 and filled metal trench, such that that the top surface of the high-k gate dielectric material 450 serves as a starting structure on which to build the device electrodes 130. Also, the high-k gate dielectric material 450 (e.g., $HfO_2$) serves as a good etch stop layer when etching the pattern of the electrodes 130 through the dielectric layer 114.

The high-k dielectric layer 450 can be a dielectric material having a dielectric constant greater than 3.9, 7.0, or 10.0. Non-limiting examples of suitable materials for the high-k dielectric layer 450 can include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

Figure 5:
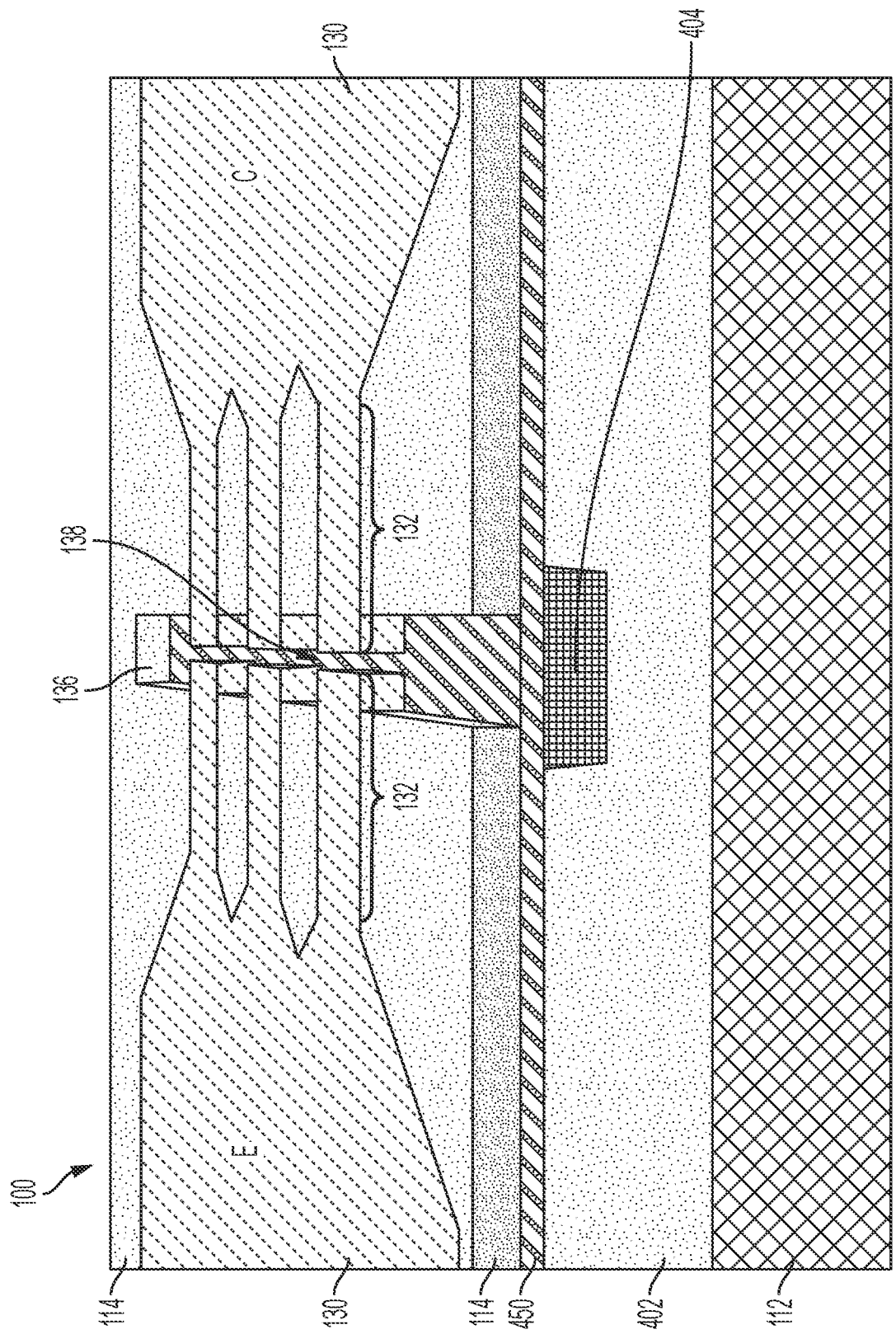
FIG. 5 depicts a perspective view of the semiconductor device having a cut-way portion according to embodiments of the invention.

In addition to making enhancements to the electrodes 130 to form a layered emitter/collector electrode 130 and modifications to the gate architecture to utilize a local bottom gate 404, modifications can made for current enhancement. FIG. 5 depicts a cut-away of a perspective view of the semiconductor device 100 with multiple electrode tips 132 per electrode 130 according to embodiments of the invention. The electrode tips 132 are layered as discussed herein but are not shown for simplicity and so as not to obscure the figure. FIG. 5 is a multi-nanowire electrode configuration which can be used to enhance the collector current received by the collector electrode. A large number of parallel emitter electrode tips 132 (nanowire emitters) of electrode 130 can be packed together with complimentary collector electrode tips 132 (nanowire collectors) as depicted in FIG. 5 and/or with a single wide collector electrode not shown (matching the entire width from one end of the parallel emitter tips to the other) that captures electrons from all the emitter electrode tips 132 (nanowire emitters). Current enhancement occurs from using the multiple electrode tips 132 for emitter and collector electrodes 130 in conjunction with using multi-layered electrodes 130 of low workfunction layers 302A, 302B and high workfunction layers 122A, 122B, 122C. As such, this allows more electrons (or current) to be emitted from the multiple layered emitter tips 132 and received by multiple (layered) collector tips 132, when a gate voltage is applied to the local bottom gate 404 (or global backgate).

Figure 6A:
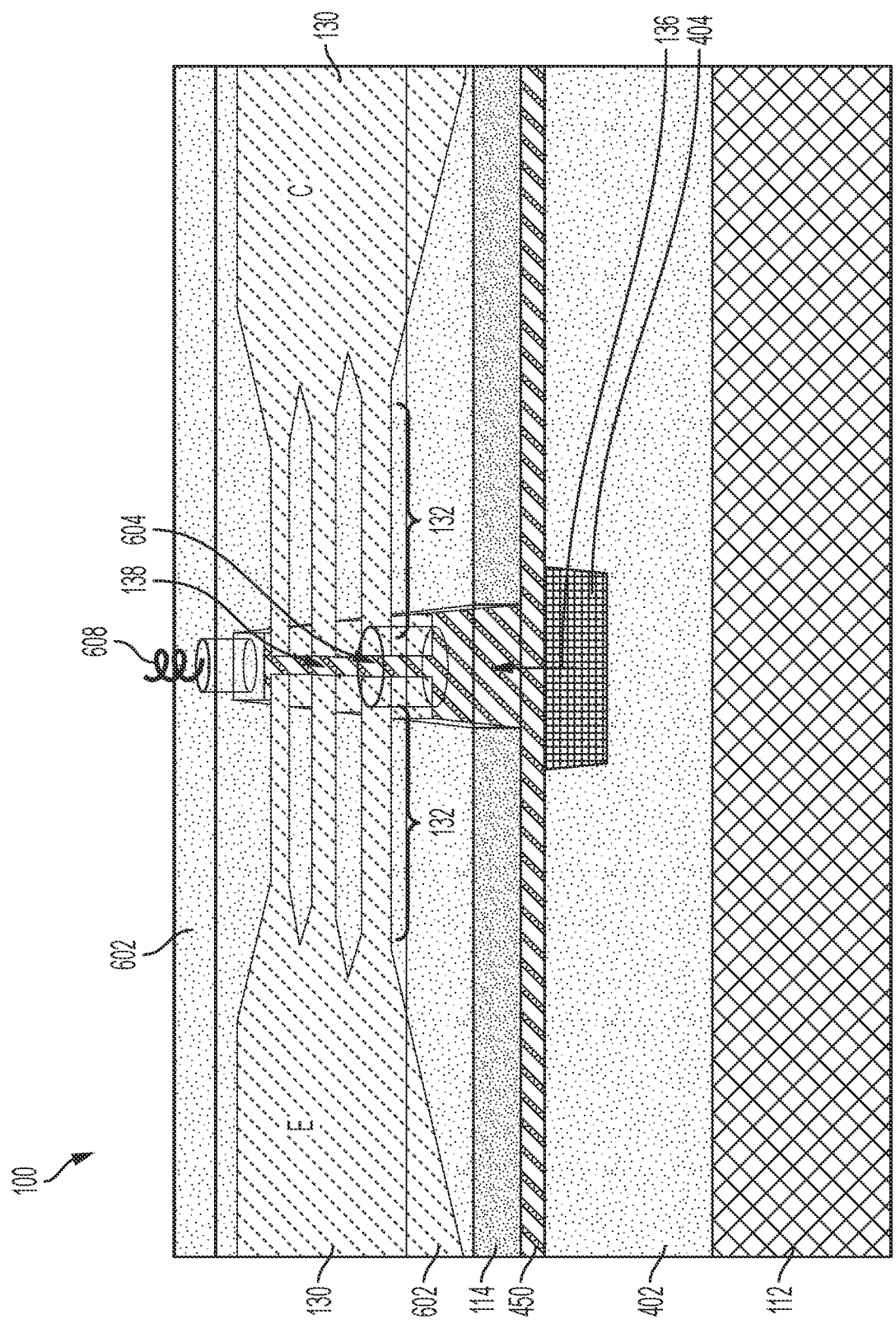
FIG. 6A depicts a perspective view of the semiconductor device having a cut-way portion according to embodiments of the invention.
Figure 6B:
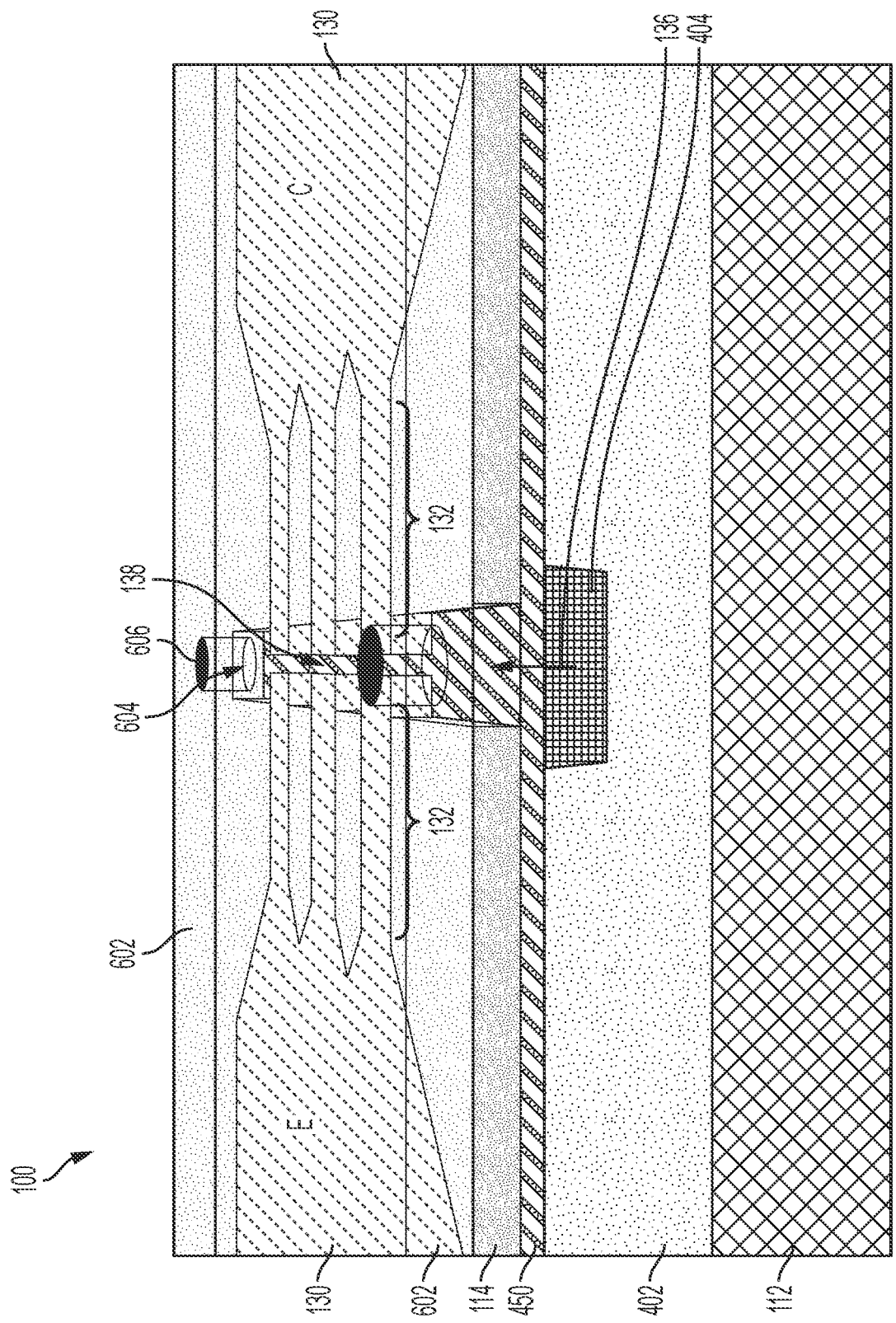
FIG. 6B depicts a perspective view of the semiconductor device having a cut-way portion according to embodiments of the invention.

In addition to the enhancements discussed herein, embodiments of the invention further provide methods of sealing off the channel 136. FIG. 6A depicts a cut-away of a perspective view of the semiconductor device 100 prior to completely sealing the channel 136 according to embodiments of the invention. FIG. 6B depicts a cut-away of a perspective view of the semiconductor device 100 with a sealed channel 136 according to embodiments of the invention. Although not shown for simplicity and so as not to obscure the figures, the electrode tips 132 of electrodes 130 can be layered as discussed herein. Also, although the local bottom gate 404 is illustrated, a global backgate can be used instead.

In FIGS. 6A and 6B, the semiconductor device 100 includes a top layer 602 (ceiling) and vent holes 604. FIG. 6B illustrates the vent holes 604 sealed with a cover material 606. This structure can be accomplished by depositing a sacrificial material 608 in the channel 136 and polishing (CMP) the sacrificial material back to fit in the trench/channel 136. The sacrificial materials 608 acts as a place holder so that the channel 136 and nanogap 138 will not be filled in by the subsequent deposition of the top layer 602. The sacrificial material can be an organic planarization layer (OPL) and/or a resist material. Although not as good, poly-silicon could be utilized as the sacrificial material. The top layer 602 is formed on the top surface of the semiconductor device 100 including the sacrificial material in the channel 136 and electrodes 130. The top layer 602 can be an oxide such as silicon dioxide. Vent holes 604 are formed through the top layer 602 directly over the channel 136 such that the vent holes 604 access the channel 136. The vent holes 604 are in preparation to remove the sacrificial material 608 from the channel 136. The vent holes 604 can be formed by lithography and RIE etching. For example, a resist material can be formed on the top layer 602, e-beam or photolithography can be performed to pattern the shape of the vent holes 604 in the resist material, and this pattern is etched into the top layer 602 over the channel 136 to form the vent holes 604.

When the sacrificial material is OPL material and/or a resist material, oxygen plasma extraction (e.g., performed in a vacuum environment) is used to remove the sacrificial material via the vent holes 604. The oxygen plasma converts the sacrificial material 608 into a gas 608 that exits through the vent holes 604, thereby leaving the channel 136 as an open cavity (i.e., empty) with the top layer 602 as the ceiling. In the case when poly-silicon is the sacrificial material, $XeFl_2$ gas phase extraction is performed to remove the poly-silicon thereby opening the cavity in the channel 136.

After removing the sacrificial material, the vent holes 604 can be closed by depositing an oxide (such as a PECVD oxide) as a cover material 606 that seals or plugs the vent holes 604 as depicted in FIG. 6B. This forms the sealed air or vacuum channel 136 which completes the vacuum/air channel transistor structure 100 with sub-10 nanometer nanogaps and layered metal electrodes 130 according to embodiments of the invention. It should be appreciated that the cover material 606 covers the entire surface of the semiconductor device 100 although the cover material 606 is only shown covering the vent holes 604 for simplicity and so as not to obscure the figure. It should be noted that the medium (space) between the emitter and collector is not at atmospheric pressure but in a vacuum (just like in a vacuum tube) so that air molecules will not degrade device performance. However, in some embodiments of the invention, the vent holes 604 can remain open and are not sealed with the cover material 606.

Technical benefits and advantages provide the semiconductor device 100 as a gate-insulated air channel transistor with emitter and collector electrodes separated by a nanogap. Operationally, the semiconductor device 100 relies on thermionic emission and tunneling (from the emitter electrode tip 132, through the nanogap 138 in the channel 136, to the collector electrode tip 132) as opposed to the drift-diffusion mechanism associated with solid-state transistors. At a certain emitter voltage (applied to the emitter electrode 130 via the probe 142) when the gate voltage (applied to the global backgate or local bottom gate 404) exceeds the turn-on voltage ($V_{turn-on}$), the vacuum energy level in the channel 136 close to the emitter electrode tip 132 of the emitter electrode 130 is pulled downward, enabling quantum mechanical tunneling of electrons through the barrier and the semiconductor device 100 enters its ON-state mode of operation. The key to lowering the collector voltage $V_c$ (i.e., voltage applied to the collector electrode 130 via its probe 142) and $V_{turn-on}$ in this device 100 to operate with low-power is enhancing the field emission of the emitter electrode tip 132 and improve coupling with the gate (global backgate and/or local bottom gate 404). $V_{turn-on}$ is defined as the voltage required to obtain an electric field of 1 V/m. It is noted that a sharper apex of the emitter tip can enhance the electric field as oppose to a blunt emitter tip. Nearly 100% more voltage is required for the blunt tip at small nanogaps than sharper tips. For example, the difference between 1 V and 2 V for operation is large when looking to compete with the MOSFET.

However, the choice of silicon as an emitter in the case of the state-of-the-art necessitated a blunt tip to prevent localized melting. As such, the state-of-the-art device operated with $V_c$=10V and a $V_{turn-on}$=8.8V using a blunt silicon emitter, a 150 nm gap, and a 100 nm $SiO_2$ gate oxide.

According to embodiments of the invention, a polished metal electrode is employed that can include lower workfunction emitter materials (layers 302A, 302B) that can be layered and/or sandwiched between or co-deposited with higher work function materials (layers 122A, 122B, 122C), thus confining the emitter electrode tip 132 to a one to few nanometers thickness, or smaller, embedded in an oxide (e.g., dielectric layer 114). The general fabrication process for creating the basic emitter and collector electrodes with a controlled nanogap down to about 8 nm has been discussed herein.

According to embodiments of the invention, a method of forming a semiconductor device 100 is provided. The method includes forming an emitter (E) electrode 130 and a collector (C) electrode 130 in a dielectric layer 114 such that a nanogap 138 separates the emitter electrode 130 and the collector electrode 130, a portion (e.g., electrode tip 132) of the emitter electrode 130 includes layers. The method includes forming a channel 136 in the dielectric layer 114 so as to traverse the nanogap 138 and forming a top layer 602 over the channel 136 so as to cover the channel 136 and the nanogap 138 without filling in the channel 136 and the nanogap 138, thereby forming an air channel transistor structure 100 or vacuum channel transistor structure if the vent holes 604 are sealed with a cover material 606 in a vacuum environment.

The emitter electrode 130 and the collector electrode 130 can be formed (directly) on a high-k dielectric material 450. A global backgate (e.g., highly doped substrate 112) is formed within the dielectric material 114 opposite the emitter electrode and the collector electrode. A local bottom gate 404 is formed on the high-k dielectric material 450 and within the dielectric material 114 opposite the emitter electrode and the collector electrode.

The emitter electrode 130 includes an emitter tip 132 opposing a collector tip 132 of the collector electrode 130 such that the nanogap 138 is formed between the emitter and collector tips 132. The emitter tip 132 includes the layers (e.g., low workfunction layers 302A, 302B and high workfunction layers 122A, 122B, 122C).

The collector tip 132 incudes the layers (e.g., low workfunction layers 302A, 302B and high workfunction layers 122A, 122B, 122C). The layers include at least one low workfunction material interposed in a high workfunction material. The layers include one or more low workfunction layers and one or more high workfunction layers.

The emitter electrode 130 includes a plurality of electrode tips 132 opposing one or more collector tips 132 of the collector electrode 130 in the channel 136, as depicted in FIGS. 5, 6, and 7.

Sacrificial material 608 is formed in the channel 136 as a place holder, prior to forming the top layer 602. Vent holes 604 are formed in the top layer 602. An extraction process is performed to remove the sacrificial material 608 via the vent holes 604. A cover material 606 is formed over the vent holes 604 to seal the channel 136.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   an emitter electrode and a collector electrode formed in a dielectric layer such that a nanogap separates the emitter electrode and the collector electrode, a portion of the emitter electrode comprising layers;
   a channel formed in the dielectric layer so as to traverse the nanogap; and
   a top layer over the channel so as to cover the channel and the nanogap without filling in the channel and the nanogap, thereby forming a vacuum channel transistor structure, wherein vent holes are above the channel and adjacent to the nanogap.

2. The semiconductor device of claim 1, wherein a dielectric material is formed on a global backgate underlying the channel.

3. The semiconductor device of claim 1, wherein the emitter electrode and the collector electrode are formed on a high-k dielectric material.

4. The semiconductor device of claim 3, wherein the high-k dielectric material is formed on a local bottom gate.

5. The semiconductor device of claim 1, wherein the emitter electrode comprises an emitter tip opposing a collector tip of the collector electrode such that the nanogap is formed between the emitter and collector tips.

6. The semiconductor device of claim 5, wherein the emitter tip comprises the layers.

7. The semiconductor device of claim 5, wherein the collector tip comprises the layers.

8. The semiconductor device of claim 5, wherein the layers comprise at least one low workfunction material interposed in a high workfunction material.

9. The semiconductor device of claim 1, wherein the layers comprise one or more low workfunction layers and one or more high workfunction layers.

10. The semiconductor device of claim 1, wherein the emitter electrode comprises a plurality of electrode tips opposing one or more collector tips of the collector electrode in the channel.

11. The semiconductor device of claim 1, wherein the channel is a vacuum environment.

12. A semiconductor device comprising:
   an emitter electrode and a collector electrode formed in a dielectric layer such that a nanogap separates the emitter electrode and the collector electrode, a portion of the emitter electrode comprising layers;
   a channel formed in the dielectric layer so as to traverse the nanogap; and
   a top layer over the channel so as to cover the channel and the nanogap without filling in the channel and the nanogap, thereby forming a vacuum channel transistor structure, wherein vent holes are formed in the top layer.

13. The semiconductor device claim 1, wherein a cover material is formed over the vent holes in the top layer such that the cover material seals the channel in a vacuum environment.

14. A semiconductor device comprising:
   an emitter electrode and a collector electrode formed in a dielectric layer such that a nanogap separates the emitter electrode and the collector electrode, a portion of the emitter electrode comprising layers of low workfunction material and high workfunction material, the emitter electrode comprising one or more elongated emitter tips, the collector electrode comprising one or more elongated collector tips;
   a channel formed in the dielectric layer so as to traverse the nanogap;
   a top layer over the channel so as to cover the channel and the nanogap without filling in the channel and the nanogap;
   one or more vent holes formed in the top layer so as to communicate with the channel; and
   a cover material sealing the one or more vent holes.

15. The semiconductor device of claim 14, wherein a dielectric material is formed on a global backgate underlying the channel.

16. The semiconductor device of claim 14, wherein the emitter electrode and the collector electrode are formed on a high-k dielectric material.

17. The semiconductor device of claim 16, wherein the high-k dielectric material is formed on a local bottom gate.

18. The semiconductor device of claim 14, wherein the emitter electrode comprises an emitter tip opposing a collector tip of the collector electrode such that the nanogap is formed between the emitter and collector tips.

19. The semiconductor device of claim 18, wherein the emitter tip comprises the layers.

20. The semiconductor device of claim 18, wherein the collector tip comprises the layers.

* * * * *